United States Patent [19]

Engeler et al.

[11] Patent Number: 5,047,771
[45] Date of Patent: Sep. 10, 1991

[54] APPARATUS FOR IMPLEMENTATION OF DESIRED INPUT/OUTPUT FUNCTION IN AN ELECTRONIC SYSTEM HAVING A PLURALITY OF CHANNELS

[75] Inventors: William E. Engeler, Scotia; Matthew O'Donnell, Schenectady; John J. Bloomer, Schenectady; John T. Pedicone, Schenectady, all of N.Y.

[73] Assignee: General Electric Company, Schenectady, N.Y.

[21] Appl. No.: 518,600

[22] Filed: May 3, 1990

[51] Int. Cl.[5] .............................................. H03M 1/12
[52] U.S. Cl. ..................................... 341/140; 341/155
[58] Field of Search ............... 341/118, 120, 106, 155, 341/140; 364/571.07, 571.05, 571.04, 571.01; 371/16.1

[56] References Cited

U.S. PATENT DOCUMENTS 4,896,282 1/1990 Orwell ........................... 364/571.05
4,903,026 2/1990 Tiemann et al. .................... 341/131
4,983,970 1/1991 O'Donnell et al. ................. 341/122

Primary Examiner—A. D. Pellinen
Assistant Examiner—Brian K. Young
Attorney, Agent, or Firm—Marvin Snyder; James C. Davis, Jr.

[57] ABSTRACT

Apparatus for providing a desired output signal as a function of a single-valued input signal in an electronic system, includes: an addressable memory, having a plurality L locations, each for storage of a data word of B bits; a circuit for storing in each of the L locations of the memory means a B-bit data word having a value selected to provide a particular output value; and circuitry for converting a present single-valued increment of input signal to a unique address, within the range of allowable locations of the memory, to cause each increment of input signal to select the associated one of the L data word locations, from which to output corresponding data.

9 Claims, 3 Drawing Sheets

APPARATUS FOR IMPLEMENTATION OF DESIRED INPUT/OUTPUT FUNCTION IN AN ELECTRONIC SYSTEM HAVING A PLURALITY OF CHANNELS

BACKGROUND OF THE INVENTION

The present invention relates to transfer function generation in electronic systems and, more particularly, to novel apparatus for facilitating implementation of any desired single-valued input/output, transfer and the like functions in an electronic system.

Many electronic systems require implementation of a specific transfer function which maps a present input signal into a corresponding output signal. As an example, and without limitation, consider an ultrasonic imaging system of the phased-array, sector-scanning (PASS) type; a plurality of transducers are arrayed to transmit and receive vibratory energy, with the output of each transducer being processed in a separate channel of electronic circuitry. All channels are identical, at least at the block level and typically contain at least one analog-to-digital converter (ADC), which is utilized for converting the analog RF signal from each channel transducer, at any instant, into a digital data word for processing. The ADC(s) in each channel carry out conversions at a sample frequency of at least two times, and usually four times, the maximum operating imager frequency. In an ultrasonic medical imager utilizing signals of up to 10 MHz, each of the N channels (where N is presently on the order of 64) requires the use of at least one ADC of 7 or 8 bit output resolution, and operating at a 20 or 40 MHz sampling rate; those skilled in the art will immediately realize that seven or eight bit ADC resolution is insufficient to provide the at least 70 dB of instantaneous dynamic range required in each channel of the imaging system. In order to use a linear ADC of lesser resolution to realize a large imaging system dynamic range, the method (described and claimed in co-pending application Ser. No. 207,532, filed June 16, 1988, now U.S. Pat. No. 5,005,419 assigned to the assignee of the present invention and also incorporated here in its entirety by reference) used provides predetermined nonlinearity in front of the linear ADC, to compress the analog signal prior to conversion to a digital data word; the digital data word is then further processed in accordance with another non-linear mathematical function which is selected to be the inverse (expansion) of the previously-employed mathematical (compressive) function, so that the value of the expanded digital data words are again linearly related to the value of the input analog RF (echo) signal voltages provided to the input of the compressive amplifier. The inverse (expansion) non-linear relationship may be provided in the ADC itself, or may be provided in a subsequent stage, which may utilize a look-up table approach. The latter approach is particularly desirable if a compression amplifier approximates a power law function and a static-random-access-memory (SRAM) circuit provides an output signal which preserves both the input sign and the inverse power law exponent. For example, utilizing an ADC with a 7-bit-wide output data word, in a system requiring an 11-bit-wide data word for realization of the required instantaneous dynamic range, the power law (i.e. $\log(V_{out}) = k \log(V_{in})$) results in $k = 0.6$ for the compressive stage, and an expansion stage constant $k' = 1/k = 5/3$.

While the above-described subsystem (i.e. compression analog amplifier, ADC and expansion digital RAM look-up remap stage) allows the instantaneous system dynamic range to be increased to the desired level, utilizing the preselected nonlinear compressive/expansive complementary functions, we have found that any desired single-valued function can be provided simultaneous with the ability to remove many other system nonlinearities, and also to remove certain classes of nonlinearities generated by imperfections in the channel apparatus. It is highly desirable to provide a subassembly which allows any desired single-valued function to be implemented and to provide for simultaneous multiple functions, such as inverse dynamic range decompression, correction of ADC and other component nonlinearities, correction of subassembly gain differences and the like.

BRIEF SUMMARY OF THE INVENTION

In accordance with the invention, apparatus for providing a desired output signal as a function of a single-valued input signal in an electronic system, includes: an addressable memory, having a plurality L locations, each for storage of a data word of B bits; means for storing in each of the L locations of the memory means a B-bit data word having a value selected to provide a particular output value; and means for converting a present single-valued increment of input signal to a unique address, within the range of allowable locations of the memory, to cause each increment of input signal to select the associated one of the L data word locations, from which to output corresponding data.

In one possible embodiment, an analog input signal is operated upon, according to a predefined function prior to analog-to-digital conversion (e.g to map the large instantaneous dynamic range of a channel signal into the dynamic range of an M-bit ADC) and the resulting digital signal is operated upon, or remapped, by another predetermined function to modify the digital data of the ADC output to a desired total output function of the single-valued input signal. A memory load signal enables counting means to sequentially address the memory, facilitating loading of the memory data words, upon startup and/or recalibration of the system channels. The apparatus of the present invention may include additional registers, counters and multiplexers (MUX) as means for facilitating the above-described operation.

Accordingly, it is an object of the present invention to provide novel apparatus for providing a desired value of output signal for each different incremental value of input signal in an electronic system.

These and other objects of the present invention will become apparent to those skilled in the art upon reading of the following detailed description of the invention, when considered in conjunction with the appended drawings.

DETAILED DESCRIPTION OF THE INVENTION

Figure 1:
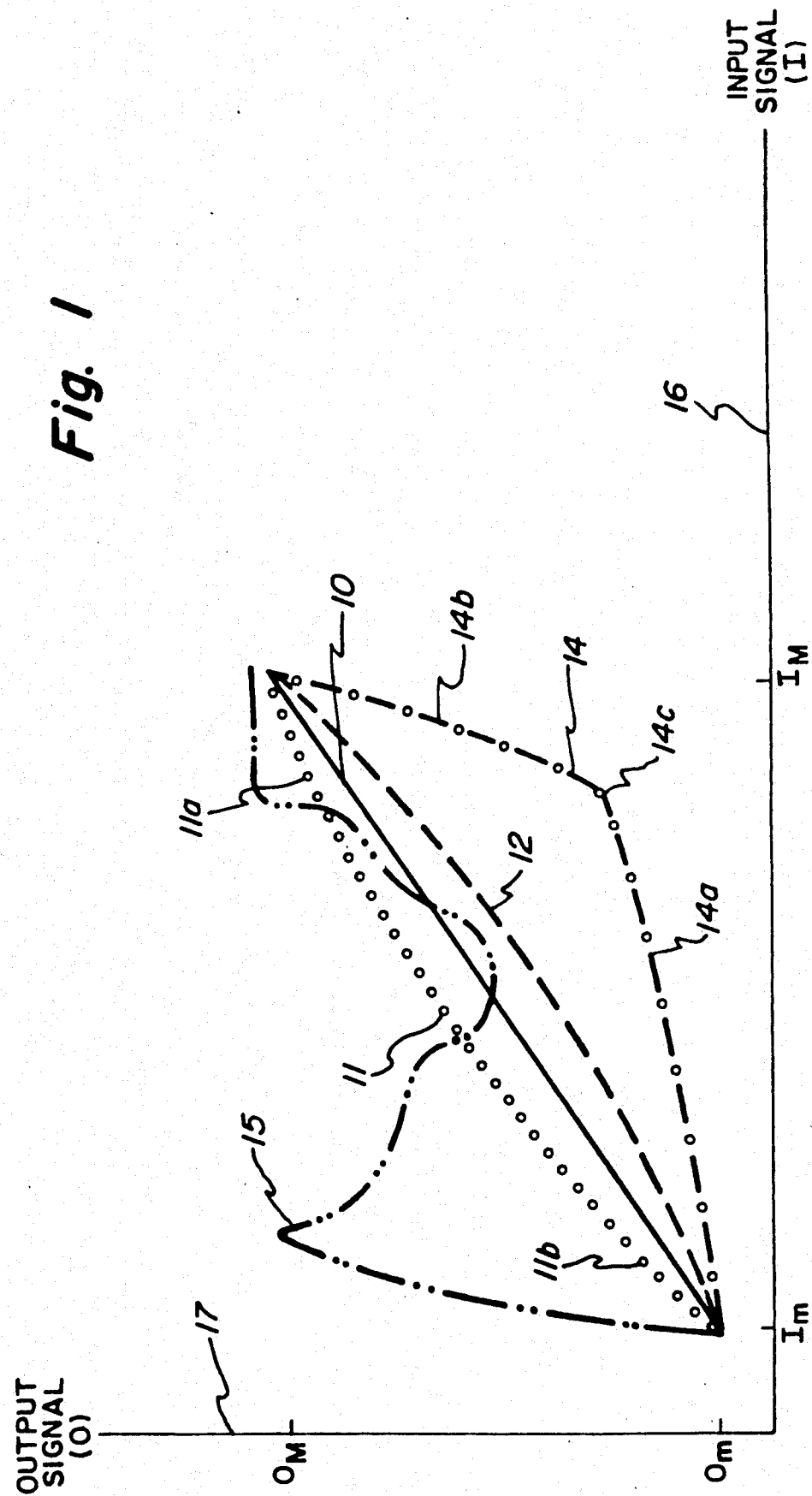
FIG. 1 is a graph illustrating various linear and non-linear signal relationships which might be required in an electronic system.

Referring initially to FIG. 1, a graph is shown in which amplitude of an input signal I is plotted along the abscissa, from a minimum input amplitude $I_m$ to a maximum input amplitude $I_M$, and amplitude of an output signal O appears along the ordinate, from a minimum output amplitude $O_m$ to a maximum output amplitude $O_M$. An ideal channel transfer function is graphed by solid line 10, as a straight line representing a linear analog RF signal input-to-output data relationship. If certain forms of transfer functions, such as use of analog compression prior to analog to digital conversion are used, a non-linear function similar to that shown by the dotted-line 11 transfer function may be realized, so that relatively large incremental changes in input amplitude near the maximum $I_M$ portion 11a provide the same magnitude of output change as would be provided by much smaller increments of input changes near the minimum input $I_m$ portion 11b of the curve. This compression function is may be later corrected for by the use of the non-linear inverse relationship illustrated by the broken-line curve 12. One example uses the function log O = k log I, where k is about 0.6, for curve 11; the opposite curve 12 would utilize a constant k' of 5/3. Some arbitrarily non-linear transfer curve, such as the chain-line curve 14 may actually occur; curve 14 has a plurality of segments (here a pair of segments 14a and 14b) which may themselves be non-linear, and may have rather abrupt breakpoints (such as the breakpoint 14c) therebetween. In fact, we have found that any arbitrary output signal O may be provided as a function of a single-valued incremental input signal I. In accordance with the principles of the present invention, we divide the range (from a minimum value $I_m$ to a maximum value $I_M$) into substantially equal increments (preferably of binary, e.g. $2^m$, substantially equal ranges) and allow each input increment to correspond to a given output signal. The input signal increment addresses a memory in which the final digital data word is stored, for the corresponding increment. The output data word is taken from storage whenever the ADC output digital data provides a corresponding value, as a memory addressing function. Thus, any transfer (i.e. input-to-output) function 15, which may be not only monotonic but also single-valued in I (i.e. have any one value of the dependent variable, here output signal O, for each single increment of independent variable, here input signal I) can be provided.

Figure 2A:
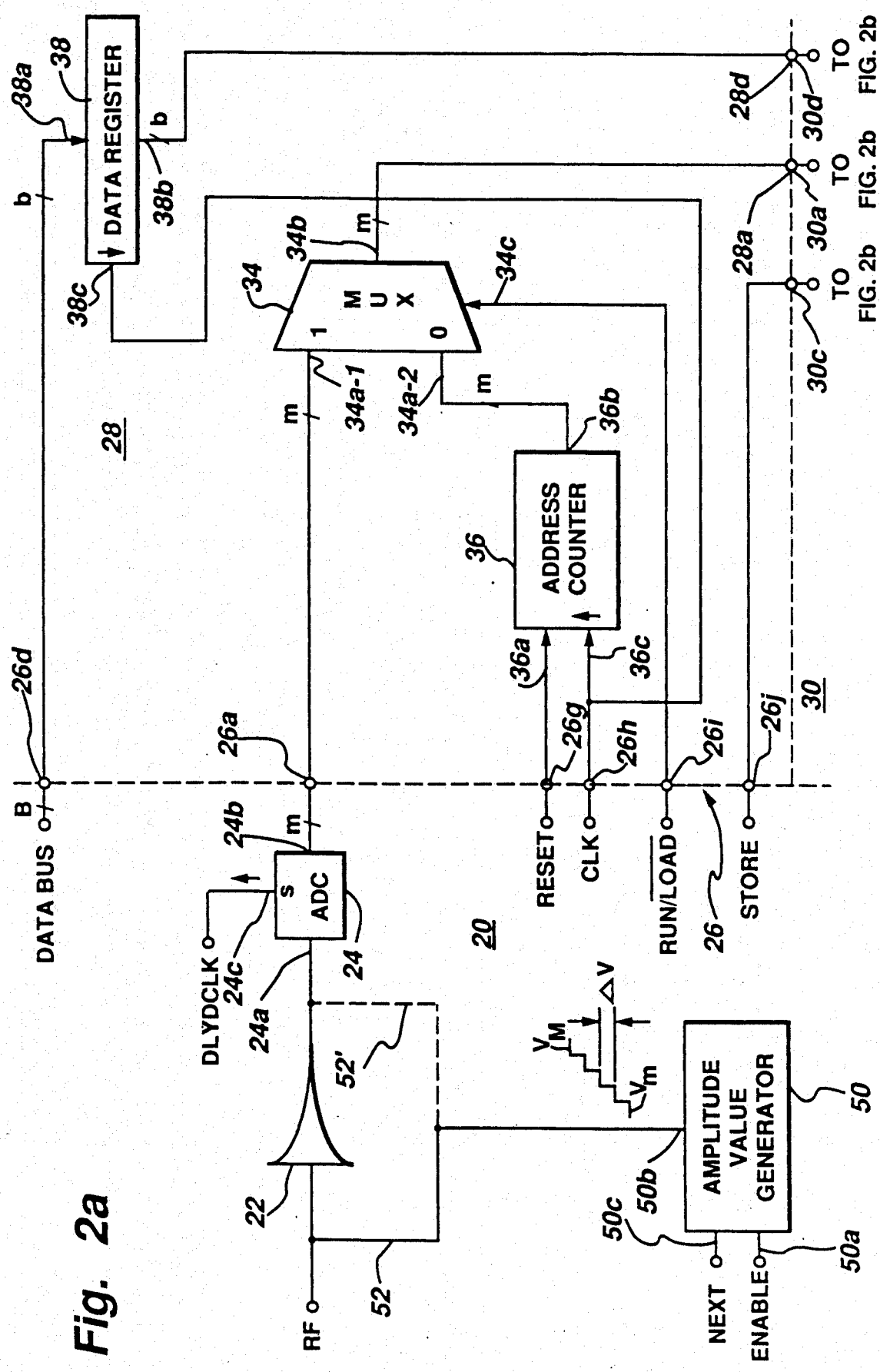
FIGS. 2a and 2b together make up a schematic block diagram of one possible embodiment of our novel apparatus in accordance with the principles of the present invention.
Figure 2B:
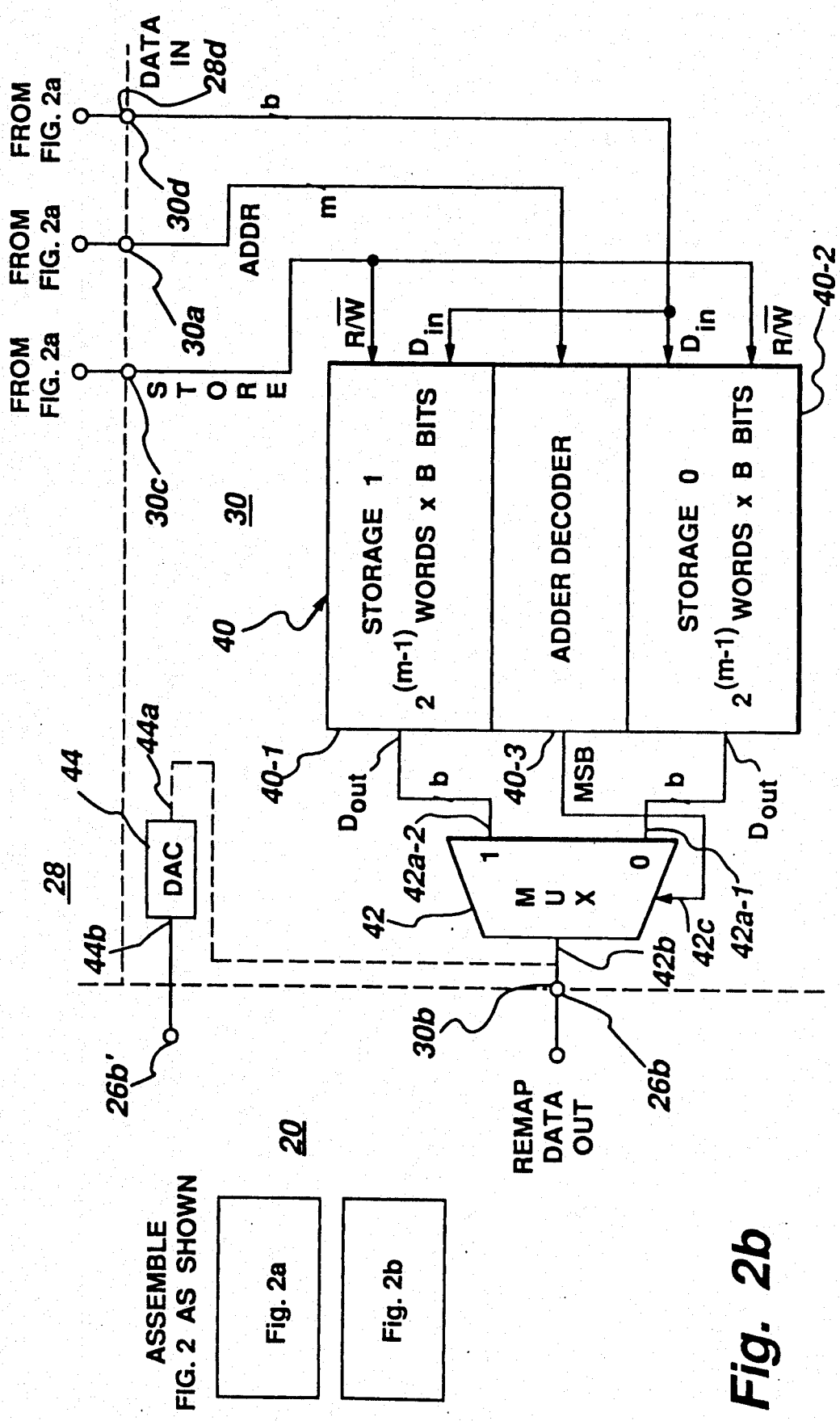

Referring now particularly to FIGS. 2a and 2b, an assembly 20 for providing the desired arbitrary output signal O as a function of incremental input signal is shown. The input signal may be an analog RF (ultrasound) energy from a channel transducer (and from any intervening T/R (i.e. transmit/receive) switching means time-gain-control amplifier and the like), with signal processing provided by a compression amplifier means 22. The compressed analog signal appears at an analog input 24a of an analog-to-digital converter ADC means 24, which provides a multiple bit output data word, of m bits width, at a digital data output port 24b, responsive to each occurrence of a strobe signal at a strobe input 24c. In an illustrative system, a 7 bit flash ADC might sample an RF signal of up to 8 MHz at a 20 MHz sample rate. The m-bit-wide data word of each sample is provided to a first input 26a of a remap means 26.

In accordance with the principles of the present invention, the digital remap means 26 provides analog, digital or combined output signals at an output data port 26b. A remapped digital data word is provided at output 26b for that digital data word then present at input 26a. Data for storage is provided on a data bus to an input 26d of the remap means. The digital remapping means 26 includes an input means 28 and a random-access memory (RAM) means 30, which may include static or dynamic RAM. The m-bit-wide data word at ADC output means 24b appears at input 26a and is coupled to a one-select first input 34a-1 of a multiplexer (MUX) means 34, having a zero-select second input 34a-2 connected to the output 36b of an m-bit address counter means 36. Address counter means 36 has a reset input 36a which receives a reset signal from SRAM means input 26g and receives a clock CLK signal from another input 26h. The m-bits of the data word at address counter output 36b will appear at the (load/run) MUX means output 34b if the logic state of a normal/load select signal at another SRAM means input 26i provides a logic-zero signal to the second MUX means control input 34c; if a logic-one bit is provided at input 34c, the ADC output data is provided at output 34b and of mux 34 and thence to input means address ADDR output port 28a.

A data register 38 has a b-bit-wide data word input port 38a receiving b-bits of parallel data from data bus input 26d for temporary storage and for providing the data at an output port 38b, both responsive to an edge of the clock CLK signal provided from input 26h to a register clock input 38c; the storage operation is performed responsive to the latter opposite edge of the clock CLK waveform from the earlier edge used to advance the count in ADDR counter means 36. The b-bit-parallel data word is provided from data register output 38b to an input means data output port 28d.

The RAM portion 30 has an address ADDR word input port 30a and data DATA IN word input port 30d respectively providing m-bit-wide and b-bit-wide data signals to a memory means 40. In one presently preferred configuration, the actual random access memory 40 comprises first and second storage blocks 40-1 and 40-2, denominated STORAGE 0 and STORAGE 1, each having static storage for $L = 2^{(m-1)}$ words of B bits (e.g. 64 words of 10 bits each, where m = 7 and B = 10 in the illustrated embodiment). The two data storage blocks 40-1 and 40-2 share a common address decoder means 40-3, which decodes the (m-1) lower bits of the m-bit address word into one of $2^{m-1}$ addresses and selects that address in both blocks 40-1 and 40-2; the highest bit of the address word selects block 0 or block 1 by its logic state. Thus, the address ADDR information is simultaneously applied in parallel to the input 30a of the RAM means, while the b-bit-wide input data is supplied to data inputs $D_{in}$ of both blocks and is stored within the appropriate one of blocks 40-1 or 40-2 as selected by, address decoder 40-3 (e.g. block 0 selected by MSB=0 and block 1 selected by MSB=1, where MSB is the most significant bit) responsive to a STORE (write) low-logic-level command received at the memory read/write (R/e,ovs/W/ ) input from a RAM means input 30c. When input 30c receives a read (high-logic-level) command, data is provided at each of the two output data $D_{out}$ ports from a location within the associated one of the two storage blocks; the selection of the internal location is dependent upon the address data word then provided at input 40a. Proper output data is present only at that one of the two storage blocks determined by the then-present value of the most significant bit (MSB) of the address data; the MSB value is carried through the decoder means 40-3 and is provided at address decoder output 40b. This MSB value is provided to the control bit 42c of a third MUX means 42, receiving the output data from one storage block 40-2 at a first, or zero-select, input 42a-1 and the output data of the other storage block 40-1 at the one-select second input 42a-2. The block selected by the MSB signal provides the data at the MUX means output 42b, which is also the RAM output 30b and the remap means output port 26b. Alternatively, or in addition to the digital output port 26b, an analog output signal can be provided by use of a digital-to-analog converter DAC means 44, receiving the digital output data word at a digital input port 44a and providing the corresponding analog signal amplitude therefor at output 44b and port 26b'.

In accordance with still another principle of the present invention, an amplitude value generator means 50 receives an enable signal 50a to provide a RF signal of known frequency and known amplitude at an output 50b. When initially enabled, the signal at output 50b has a first (typically zero) amplitude. The "amplitude", i.e. the size of the signal sampled by the ADC, is increased by a substantially fixed amount $\Delta V$ in step-wise manner whenever a next-step NEXT signal is provided at a control input 50c. The NEXT signals may be provided in a manner selected to cause each RF signal to appear at a rate commensurate with the frequency of normal operation of the channel. Thus, the amplitude of the RF signal at output 50b can be stepped in the input-signal-increments $\Delta I$ from a minimum value to a maximum value in essentially equal steps of size $\Delta V$, and this step-wise analog signal can be provided, as required, to various points within the analog front-end of each channel 20. As shown, the stepped signal is provided via connection 52 to the input of compression amplifier 22, although other connections, such as via connection 52' to the ADC input and at other analog locations within each channel, can be individually programmably provided as required.

Operation of the apparatus 20 can commence by initially loading data in RAM 40, responsive to a logic-one pulse at reset input 26g, followed by a logic-zero load signal at input 26i and one cycle of the clock CLK signal at input 26g for each RAM location. Thus, address counter 36 is first reset to a zero count by a logic-one pulse at input 26g and is then enabled, by input 26g returning to the logic-zero state, to up-count responsive to each pulse of the CLK signal at input 26h. The successively greater values of the address words at counter output 36b are applied via MUX 34 (due to a logic-zero load level at control input 34c, from input 26i) to the RAM means ADDR input 30a. A selected b-bit-wide data word is provided to input 26d and is latched into register 38 on the latter edge of that CLK pulse which advanced the address count, in counter means 36, on an earlier edge. The STORE bit signal at input 26j then goes to a low logic (e,ovs/w/ ) level to enable writing of data into RAM 40 and the data word at input port 30d is stored at the RAM location having the address then present at ADDR port 30a. The CLK signal is cycled and a next-sequential address count appears at counter output 36b, and at port 30a. Responsive to each new address word, the STORE level is cycled to cause a new data word from input 26d (as temporarily stored within the data register 38, and provided at the output 38b thereof) to be then stored in RAM means 40. In this manner, the entire range of amplitude values are generated and the associated individual addresses are utilized to map the associated single data word of true data into storage means 40, so that a linear analog RF input/digital data word output set of values is stored. After calibration in this manner, the memory can be probed by external means, such as a microcomputer and the like, to search for any missing codes. If missing codes are generated in calibration, these memory locations can be written externally, using an interpolated value determined by data in the vicinity of the missing data code. The channel can now be operated in normal-run manner, by latching the signal at input 26j to the high (READ) level, and the signal at input 26i is high. The output data is then dependent upon, and is a predetermined function of, the input analog signal in that channel.

While one presently preferred embodiment of our novel invention has been described in detail herein, many modifications and variations will now become apparent to those skilled in the art. It is our intent, therefore, to be limited only by the scope of the appending claims and not by the specific details and instrumentalities presented by way of explanation herein.

What we claim is:

1. Apparatus for implementing a desired input/output function in each channel of a multiple channel electronic system, said each channel comprising:
   means for nonlinearly converting an analog input signal, having a present amplitude falling in one of a plurality of increments into which a full range of input signals is divided, into a digital output signal;
   an addressable memory means, having a plurality L of individually-addressable locations, each for storage of a digital data word;
   means for storing in each of the L locations of the memory means a digital data word having a value selected to impart a transfer function of a desired output signal value to said channel; and
   means for addressing, responsive to each digital data output signal from the converting means, a corresponding memory means location from which to output a stored digital data word.

2. The apparatus of claim 1, wherein the input signal range is divided into substantially equal increments.

3. The apparatus of claim 2, wherein the number of increments is a binary number $2^m$, where m is an integer greater than one.

4. The apparatus of claim 3, further comprising means for calibrating said transfer function by generating a calibration signal with an amplitude value controlled in step-wise manner over a defined range so that the outputted digital data word corresponds to said analog input signal.

5. The apparatus of claim 4, wherein the entire step-wise range of said means for calibrating said transfer function is the range from a minimum input signal value $I_m$ to a maximum input signal value $I_M$.

6. The apparatus of claim 1, further comprising means for converting the output signal data to the amplitude of an analog output signal.

7. The apparatus of claim 1 wherein the transfer function between input and output of said each channel is monotonic.

8. The apparatus of claim 7, wherein the input/output transfer function is single-valued and has only one output signal value for any one input increment.

9. The apparatus of claim 1 wherein said means for nonlinearly converting said analog input signal comprises analog-to-digital converter means and analog signal compression means for compressing said analog input signal prior to application of said analog input signal to said analog-to-digital converter means.

* * * * *